US011227806B2

(12) United States Patent
Koba et al.

(10) Patent No.: US 11,227,806 B2
(45) Date of Patent: *Jan. 18, 2022

(54) AIR CAVITY PACKAGE USING HIGH TEMPERATURE SILICONE ADHESIVE

(71) Applicant: Materion Corporation, Mayfield Heights, OH (US)

(72) Inventors: Richard J. Koba, Saugus, MA (US); Chee Kong Lee, Euro Asia Park (SG); Wei Chuan Goh, Skudai (MY); Sin Yee Chin, Singapore (SG)

(73) Assignee: Materion Corporation, Mayfield Heights, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/590,144

(22) Filed: May 9, 2017

(65) Prior Publication Data

US 2017/0323837 A1 Nov. 9, 2017

Related U.S. Application Data

(60) Provisional application No. 62/333,627, filed on May 9, 2016.

(51) Int. Cl.
*H01L 23/14* (2006.01)
*H01L 23/047* (2006.01)
*H01L 23/04* (2006.01)
*H01L 23/10* (2006.01)
*H01L 23/28* (2006.01)
(Continued)

(52) U.S. Cl.
CPC ............ *H01L 23/14* (2013.01); *H01L 23/04* (2013.01); *H01L 23/047* (2013.01); *H01L 23/10* (2013.01); *H01L 23/28* (2013.01); *H01L 23/36* (2013.01); *H01L 23/3738* (2013.01)

(58) Field of Classification Search
CPC ......... H01L 23/14; H01L 23/36; H01L 23/28; H01L 23/3738; H01L 23/047; H01L 23/04; H01L 23/10
See application file for complete search history.

(56) References Cited

U.S. PATENT DOCUMENTS 6,559,533 B1 * 5/2003 Yamamoto ............. H01L 23/10
257/705
6,949,404 B1 2/2005 Fritz et al.
(Continued)

FOREIGN PATENT DOCUMENTS

CN 105062411 11/2015
DE 112013001218 1/2015
(Continued)

OTHER PUBLICATIONS https://www.permabond.com/resource-center/temperature-resistant-adhesives/ (screen shot attached in the office action).*
(Continued)

*Primary Examiner* — Su C Kim
(74) *Attorney, Agent, or Firm* — Cozen O'Connor

(57) ABSTRACT

An air cavity package includes a dielectric frame that is formed from an alumina ceramic, a polyimide, or a semi-crystalline thermoplastic. The dielectric frame is joined to a flange using a high temperature silicone adhesive. Leads may be bonded to the dielectric frame using a high temperature organic adhesive, a direct bond, or by brazing.

19 Claims, 2 Drawing Sheets

(51) Int. Cl.
*H01L 23/36* (2006.01)
*H01L 23/373* (2006.01)

(56) References Cited

U.S. PATENT DOCUMENTS

| | | | |
|---|---|---|---|
| 2002/0000239 A1* | 1/2002 | Sachdev | C11D 7/3263 134/2 |
| 2006/0147276 A1 | 7/2006 | Lin et al. | |
| 2009/0243078 A1* | 10/2009 | Lim | H01L 23/4334 257/690 |
| 2010/0080659 A1 | 4/2010 | Halahmi et al. | |
| 2011/0012254 A1* | 1/2011 | Mohammed | H01L 23/047 257/706 |
| 2016/0028348 A1 | 1/2016 | Kushida | |

FOREIGN PATENT DOCUMENTS

| WO | WO 97/16604 A1 | 5/1997 |
|---|---|---|
| WO | WO 2015/179733 | 11/2015 |

OTHER PUBLICATIONS http://www.zimi-tech.com/enproduct/2015/0712/34.html (Year: 2015).*
Emersleben, et al., "The influence of hoop stresses and earth resistance on the reinforcement mechanism of single and multiple geocells," $9^{th}$ Intl. Conf. on Geosynthetics, pp. 713-716 (2010).
International Search Report dated Aug. 23, 2017 in PCT/US2017/031656.
The Dow Chemical Company, Adhesives and sealants selection guide, Electronics and Advanced Assembly, 2019, pp. 1-15, The Dow Chemical Company, USA.
The Dow Chemical Company, Thermally conductive materials selection guide, Electronics and Advanced Assembly Solutions, 2019, pp. 1-16, The Dow Chemical Company, USA.
The Dow Chemical Company, Sylgard 577 Primerless Silicone Adhesive, Technical Data Sheet, 2017, pp. 1-5, The Dow Chemical Company, USA.

* cited by examiner

AIR CAVITY PACKAGE USING HIGH TEMPERATURE SILICONE ADHESIVE

CROSS-REFERENCE TO RELATED APPLICATIONS

This application claims priority to U.S. Provisional Patent Application Ser. No. 62/333,627, filed May 9, 2016, the entirety of which is fully incorporated by reference herein.

BACKGROUND

The present disclosure relates to air cavity packages and methods for making the same.

An air cavity package typically includes one or more semiconductor dice attached to a base/flange and surrounded by a frame with electrical leads embedded on the frame. The dice are electrically joined to the leads, and the package is then sealed with a lid. The air serves as an electrical insulator with a low dielectric constant. Air cavity packages are extensively used for housing high frequency devices (e.g., radio-frequency power transistors). Surrounding a high frequency semiconductor chip with air improves the high frequency properties of the die and corresponding electrical leads compared to encapsulation in a material having a higher dielectric constant (e.g., a molding compound such as epoxy).

RF device manufacturers desire to minimize material and production costs associated with air cavity packages. Manufacturers have developed metallization systems that enable silicon (Si), gallium nitride/silicon carbide (GaN/SiC), and gallium nitride/silicon (GaN/Si) chips to be soldered onto copper flanges using a thin gold-tin (AuSn) solder. However, it is difficult to bond a dielectric frame to the copper flange and to the electrical leads which satisfies desired cycle properties (e.g., adherence after 1,000 temperature cycles of minus 65° C. to +150° C.). The dielectric frame is typically made of alumina, but bonding alumina to copper is problematic due to the severe mismatch between the coefficients of thermal expansion (CTEs) of these materials. In particular, the linear CTE of copper is about 17 ppm/° C. at 20° C. whereas the linear CTE of alumina is about 8 ppm/° C. at 20° C. An alumina frame soldered to a copper flange can only withstand thermal excursions that remain below about 190° C.

Some manufacturers have offered a dielectric frame made of liquid crystal polymer (LCP) which is overmolded onto copper leads to create a frame. LCP has a close CTE match to copper. The frame/lead subassembly can then be bonded onto a copper flange (after chips have been soldered onto the flange) using epoxy. However, LCP is difficult to bond with epoxy due to its extreme chemical inertness. A common failure mechanism of LCP parts is leakage at the interface between the LCP and a metal (e.g., as observed during gross leak testing in a Fluorinert® bath). Sometimes the flange must be roughened in order to achieve adequate adhesion of the epoxy between the flange and the LCP frame. Additionally, steps such as bonding the LCP frame to the flange between the steps of solder die attachment and wire bonding are necessary.

It would be desirable to develop new air cavity packages that are simpler and/or less expensive to produce. It would also be desirable to create an air cavity package with a copper base/flange that is fully assembled with a dielectric frame and electrical leads, and that can withstand subsequent assembly operations (e.g., AuSn die attachment and lid attachment) that reach temperatures of 320° C. and can withstand temperature cycling (from minus 65° C. to +150° C. for one thousand cycles).

BRIEF DESCRIPTION

The present disclosure relates to air cavity packages including a dielectric frame made of ceramic such as alumina, or a high temperature plastic such as polyimide or semi-crystalline thermoplastics. High temperature plastics are those with a decomposition temperature or melting temperature above 350° C.

Disclosed in various embodiments herein is an air cavity package adapted to contain a die, comprising: a flange having an upper surface; and a dielectric frame having an upper surface and a lower surface, the lower surface being attached to the upper surface of the flange; wherein the dielectric frame is made of a ceramic such as alumina or a high temperature plastic such as a polyimide or semi-crystalline thermoplastics.

The air cavity package may further comprise a first conductive lead and a second conductive lead, attached to opposite sides of the upper surface of the dielectric frame. The first conductive lead and the second conductive lead can be attached to the upper surface of the dielectric frame by a high temperature adhesive. Alternatively, the first conductive lead and the second conductive lead can be attached to the upper surface of the dielectric frame by a direct bond, a braze, or a high temperature reactive solder. The first conductive lead and the second conductive lead can be made of copper, nickel, a copper alloy, a nickel-cobalt ferrous alloy, or an iron-nickel alloy.

The flange can be made of copper, a copper alloy, aluminum, an aluminum alloy, AlSiC, AlSi, Al/diamond, Al/graphite, Cu/diamond, Cu/graphite, Ag/diamond, CuW, CuMo, Cu:Mo:Cu, Cu:CuMo:Cu (CPC), Mo, W, metallized BeO, metallized $Si_3N_4$, or metallized AlN.

In some embodiments, the flange is a substrate plated with one or more metal sublayers. The one or more metal sublayers can be made of nickel (Ni), gold (Au), palladium (Pd), chromium (Cr), or silver (Ag).

The dielectric frame may be attached to the surface via a high temperature adhesive, such as a silicone. High temperature adhesives are those with a decomposition temperature above 300° C.

In some embodiments, the dielectric frame further comprises a filler. The filler can be selected from the group consisting of ceramic powder, glass powder, and chopped glass fibers.

The dielectric frame may have a dielectric constant of about 3.0 to about 10.0.

Also disclosed are methods for forming an air cavity package, comprising: joining a lower surface of a dielectric frame to an upper surface of a flange using a first adhesive composition; joining a first conductive lead and a second lead to an upper surface of the dielectric frame using a second adhesive composition; and curing the first adhesive composition and the second adhesive composition, either separately or simultaneously; wherein the dielectric frame comprises a ceramic or a high temperature plastic such as a polyimide or semi-crystalline thermoplastics.

The first adhesive composition and the second adhesive composition may be high temperature silicones. Sometimes, the first adhesive composition and the second adhesive composition are cured simultaneously.

In some embodiments, the high temperature silicone adhesive composition may be a pure silicone. In other embodiments, the silicone adhesive may be a polydimethylsiloxane ("PDMS") lightly filled with silica particles. "Lightly filled" refers to the silicone adhesive containing about 20 volume percent or less (but greater than zero) of the silica particles.

The curing can be performed at a temperature in the range of from about 180° C. to about 260° C. and a pressure of about 10 psi. The flange may be formed of a copper substrate plated with nickel and/or gold.

Sometimes, the methods can further comprise attaching a die to the upper surface of the flange, wherein the dielectric frame surrounds the die.

Also disclosed are methods for forming an air cavity package, comprising: receiving a polyimide sheet laminated on a lower surface and an upper surface with a conductive material; and shaping the upper surface of the polyimide sheet to form electrical leads on opposite sides of a cavity in the polyimide sheet, the conductive material on the lower surface of the polyimide sheet being visible in the cavity. The conductive material can be copper.

Also disclosed herein are air cavity packages adapted to contain a die, comprising: a flange having an upper surface; and a dielectric frame having an upper surface and a lower surface, wherein the lower surface is attached to the upper surface of the flange via a high temperature silicone adhesive.

Also disclosed in various embodiments are air cavity packages adapted to contain a die, comprising: a flange having an upper surface; a dielectric frame having an upper surface and a lower surface, the lower surface being attached to the upper surface of the flange; and a first conductive lead and a second conductive lead, attached to opposite sides of the upper surface of the dielectric frame and each being attached to the upper surface of the dielectric frame by a high temperature silicone adhesive.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
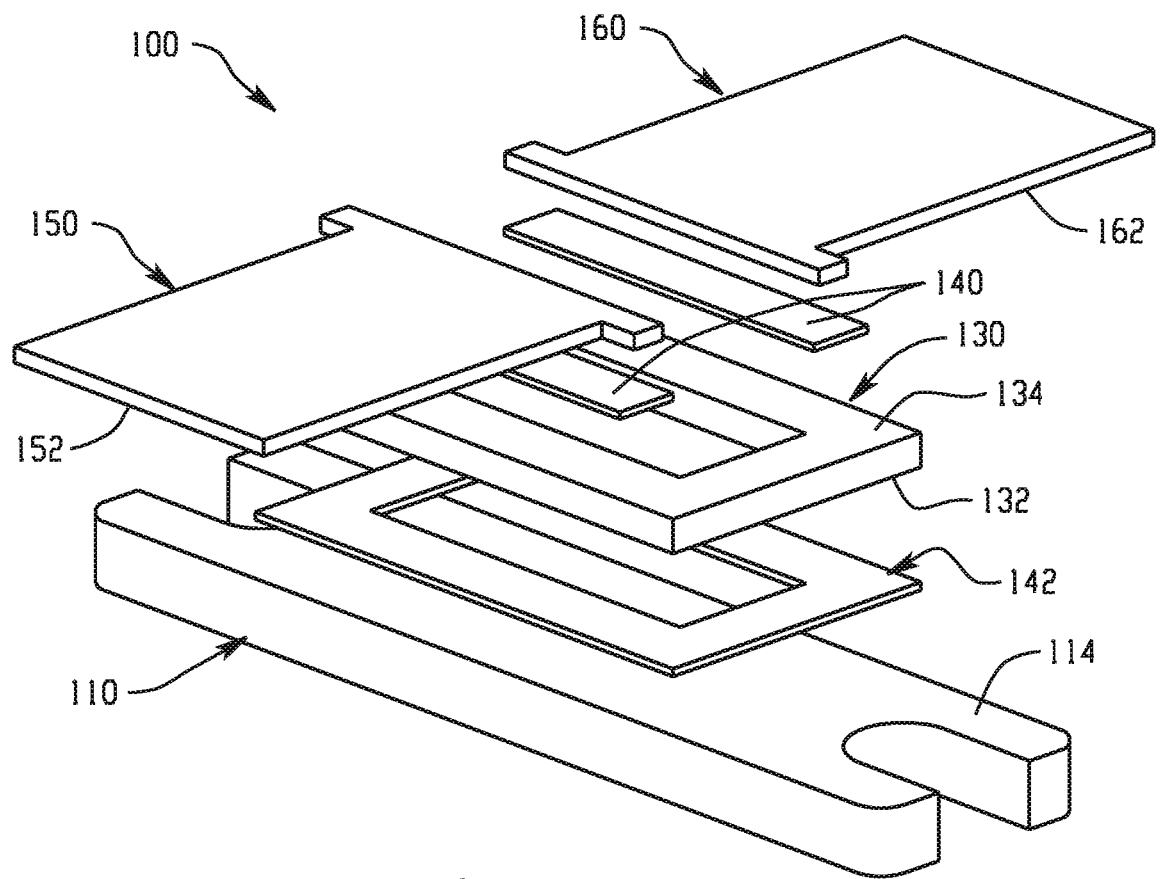
FIG. 1 is an exploded view of an exemplary air cavity package according to the present disclosure.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The singular forms "a," "an," and "the" include plural referents unless the context clearly dictates otherwise.

As used in the specification and in the claims, the term "comprising" may include the embodiments "consisting of" and "consisting essentially of." The terms "comprise(s)," "include(s)," "having," "has," "can," "contain(s)," and variants thereof, as used herein, are intended to be open-ended transitional phrases, terms, or words that require the presence of the named components/steps and permit the presence of other components/steps. However, such description should be construed as also describing compositions or processes as "consisting of" and "consisting essentially of" the enumerated components/steps, which allows the presence of only the named components/steps, along with any impurities that might result therefrom, and excludes other components/steps.

Numerical values should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently combinable (for example, the range of "from 2 grams to 10 grams" is inclusive of the endpoints, 2 grams and 10 grams, and all the intermediate values).

The terms "substantially" and "about" can be used to include any numerical value that can vary without changing the basic function of that value. When used with a range, "substantially" and "about" also disclose the range defined by the absolute values of the two endpoints, e.g. "about 2 to about 4" also discloses the range "from 2 to 4." The terms "substantially" and "about" may refer to plus or minus 10% of the indicated number.

Some terms used herein are relative terms. In particular, the terms "upper" and "lower" are relative to each other in location, i.e. an upper component is located at a higher elevation than a lower component in a given orientation, but these terms can change if the component is flipped. When different components are compared to each other though, these terms refer to the components being in a fixed orientation relative to each other. For example, a lower surface of a first component will always rest upon an upper surface of a second component that is located below the first component; the first component cannot be flipped by itself so that its upper surface then rests upon the upper surface of the second component.

The terms "above" and "below" are relative to an absolute reference; a first component that is above a second component is always at a higher elevation.

As used herein, the term "coefficient of thermal expansion" or "CTE" refers to the linear coefficient of thermal expansion at 20° C.

When an element is named alone, e.g. "aluminum", this usage refers to the element with only impurities present, e.g. pure aluminum. When used in conjunction with the term "alloy", this usage refers to an alloy containing a majority of the named element.

The present disclosure may refer to temperatures for certain process steps. It is noted that these generally refer to the temperature at which the heat source (e.g. furnace, oven) is set, and do not necessarily refer to the temperature which must be attained by the material being exposed to the heat.

Figure 2:
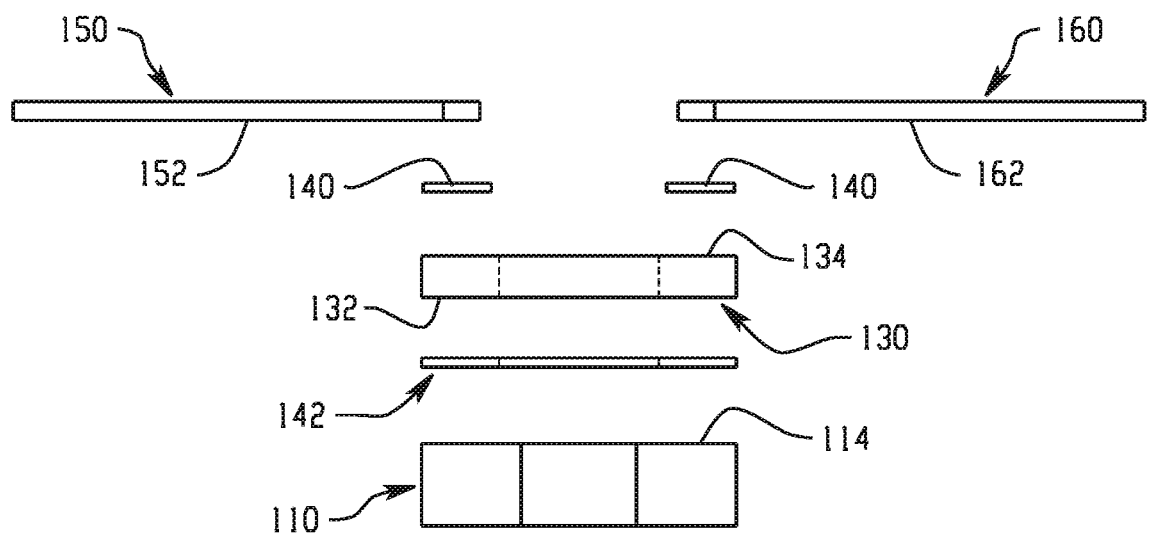
FIG. 2 is a side view of the air cavity package of FIG. 1.
Figure 3:
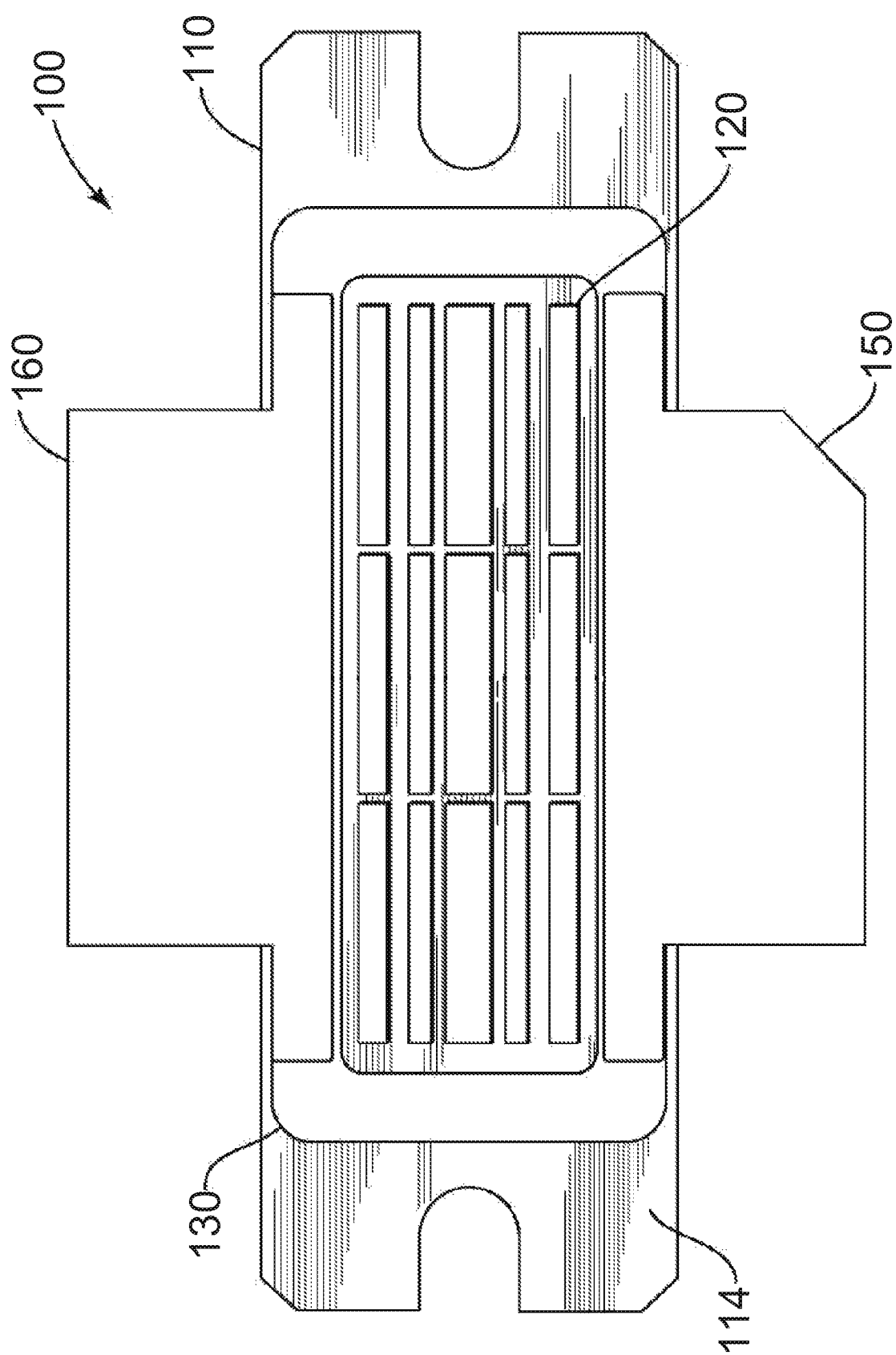
FIG. 3 is a top view of the air cavity package of FIG. 1.

FIG. 1 illustrates an exploded view of an embodiment of an air cavity package 100 according to the present disclosure. FIG. 2 is a side view of the air cavity package. FIG. 3 is a top view of the air cavity package.

The air cavity package 100 includes a flange 110, a semiconductor die 120, a first conductive lead 150, a second conductive lead 160, and a dielectric frame 130. The flange is also referred to as the base of the air cavity package. An upper surface 134 of the dielectric frame 130 is attached to the lower surface 152, 162 of each conductive lead 150, 160 by a first adhesive composition 140. The conductive leads 150, 160 are located on opposite sides of the package 100, or opposite sides of the dielectric frame 130 or the flange 110. A lower surface 132 of the dielectric frame 130 is attached to an upper surface 114 of the flange 110 by a second adhesive composition 142. The dielectric frame 130 surrounds and encloses the die 120, which is also attached to the upper surface 114 of the flange. The dielectric frame has an annular shape, i.e. a shape defined by the area between two concentric shapes.

The flange 110 acts as a heat sink for the semiconductor die, and is made of a material with medium to high thermal conductivity. The flange can be made of copper, aluminum, AlSiC, AlSi, Al/diamond, Al/graphite, Cu/diamond, Cu/graphite, Ag/diamond, CuW, CuMo, Cu:Mo:Cu, Cu:Cu-Mo:Cu (CPC), Mo, W, metallized BeO, metalized $Si_3N_4$, or metallized AlN. It is noted that CPC refers to Cu:Cu30Mo70:Cu, which usually has thicknesses of 1:4:1 or 1:1:1 for the three sublayers. It is noted that the flange can be a metal matrix composite, such as graphite dispersed within an aluminum or copper metal matrix. In particular embodiments, the flange is in the form of a substrate that is plated with one or more metal sublayers on each major surface (e.g., a plating material compatible with AuSn or nanosilver die attachment). The flange can be plated with combinations of nickel (Ni), gold (Au), palladium (Pd), chromium (Cr), and silver (Ag), as desired. In particular combinations, the flange is plated with Ni+Au, Ni+Pd+Au, Ni+Cr, Pd+Au, or Ni+Ag, with the first listed element being plated first (i.e. closest to the substrate).

The adhesive compositions 140, 142 generally include a strong, ductile high temperature adhesive (e.g., a high temperature silicone). An optimal adhesive exhibits strong adhesive strength between the flange 110 and the dielectric frame 130 at elevated temperatures, e.g., about 320° C. for a period of about 10 minutes.

The first adhesive composition 140 and the second adhesive composition 142 may be the same or different. The adhesive compositions 140, 142 may consist of the main adhesive material or may include one or more other components. In some embodiments, the adhesive composition is filled with a dielectric material (e.g., glass and/or ceramic powder). Other adhesives may be applied in a layer above and/or below the main adhesive. In some embodiments, the main adhesive is a high temperature silicone and the other adhesive is a different high temperature silicone.

The high temperature silicone can be in the form of a pure silicone. The high temperature silicone can also be described as a polydimethylsiloxane ("PDMS") lightly filled with silica particles. The term "lightly filled" refers to the amount of silica particles in the silicone as being about 20 volume percent or less of the silicone adhesive (but an amount greater than zero).

High temperature silicones are commercially available in high purities, e.g., with low halogen and alkali content. Such silicones have been found to satisfy the requirements for this assembly. Silicones have the added advantage of being able to be dispensed as fluids. Silicones can typically be cured at a temperature of about 150° C. for about 30 minutes at a pressure in the range of about 5 psig to about 10 psig (34-69 kPa).

Next, the electrical leads 150, 160 may be made of copper, nickel, a copper alloy, a nickel-cobalt ferrous alloy (e.g., Kovar®), or an iron-nickel alloy (e.g., Alloy 42, i.e. Fe58Ni42). As with the flange, the electrical leads can be plated with one or more metal sublayers, which are the same as described above.

The dielectric frame 130 is formed from alumina ceramic, a polyimide, semi-crystalline thermoplastics, or some other high temperature plastic. The dielectric frame 130 may have a thickness (i.e. height) of from about 0.2 mm to about 0.8 mm, including about 0.5 mm.

The dielectric frame 130 can be formed from a polyimide sheet obtained commercially under the tradenames Vespel®, Torlon®, or Cirlex®. The sheet can be machined in a variety of low cost methods such as stamping, laser cutting, water jet cutting, milling, and machining, to obtain the desired shape. A frame 130 made of polyimide may cost less than a conventional metallized and plated alumina frame. Additionally, the dielectric frame may be comprised of types of semi-crystalline thermoplastics having high temperature stability and high mechanical strength. An example of a semi-crystalline thermoplastic is a polyaryletherketone (PAEK) such as polyetherketoneketone (PEKK).

The dielectric frame 130 may also be formed via injection molding or direct forming. Polyimide resins that can be injection molded or direct formed include DuPont Aurum® and Vespel® resins. Extern® UH resins (commercially available from Sabic Innovative Plastics of Pittsfield, Mass.) have an unusually high service temperature of about 240° C.

Optionally, the polyimide can be filled with an insulative, non-conducting filler to modify the properties of the dielectric frame. In some embodiments, the filler is a ceramic powder, glass powder or milled glass fibers. These fillers can reduce the CTE of the dielectric frame. The filler may be present in an amount of from greater than zero to about 50 volume percent of the dielectric frame.

The plastic frame may have a dielectric constant in the range of from about 3.0 to about 6.0, including from about 3.2 to about 3.8 and from about 3.4 to about 3.6. An alumina ceramic can have a dielectric constant in the range of from about 8.0 to about 10.0.

Alumina, polyimide, and certain semi-crystalline thermoplastics are suitable materials for the dielectric frame due to their dielectric properties. Table 1 lists the properties of Cirlex® and Extern® polyimides, and polyetherketoneketone ("PEKK") as compared to conventional frame materials (i.e., alumina and LCP).

TABLE 1

| Material | Coorstek AD-96 Alumina | RJR Polymers' LCP "HTP 1280" | Cirlex polyimide sheet | Sabic Extern UH1006 unfilled | PEKK |
|---|---|---|---|---|---|
| Dielectric Constant | 9.0 | 3.8 | 3.6 | 3.4 | 3.3 |
| Loss tangent | 0.0002 | 0.002 | 0.002 | 0.008 | 0.004 |
| Dielectric Strength (V/mil) | 210 | 766 | 1200 | 550 | 600 |
| Density (g/cc) | 3.72 | 1.67 | 1.42 | 1.37 | 1.31 |
| CTE ($10^{-6}$/° C.) | 8.2 | 17 | 20 | 46 | 38 |

TABLE 1-continued

| Material | Coorstek AD-96 Alumina | RJR Polymers' LCP "HTP 1280" | Cirlex polyimide sheet | Sabic Extem UH1006 unfilled | PEKK |
|---|---|---|---|---|---|
| Moisture Absorption | Negligible | 0.02% | 4% max | 2.1% max | 0.2% max |
| Maximum Continuous Operating Temperature (° C.) | >1000 | 250 | 340 | 250 | 260 |

Advantages of polyimide over LCP include higher operating temperature and compatibility with adhesives such as epoxy and silicones.

Since LCP and polyimides exhibit similar dielectric constants, components matched to LCP dielectric frames also generally work well with polyimide frames. For example, a radio frequency power transistor designed to have RF impedance match with a LCP frame will also generally have RF impedance match with a polyimide frame.

A lid (not shown) may be added to seal the air in the air cavity of the package. In some embodiments, the lid comprises alumina ceramic or LCP. An epoxy may be used to bond the lid to the top surface of the frame, including the polyimide frame and the leads (e.g., gold-plated leads). The lid epoxy may be cured at a temperature of about 160° C.

The leads 150, 160, dielectric frame 130, and flange 110 can be aligned in a fixture and bonded together by curing the adhesive composition. Once cured, the suitable high temperature silicone can withstand an excursion of 320° C. for 5 minutes (e.g., to enable AuSn die attachment) followed by thermal excursions necessary for lidding and temperature cycle testing.

Alternatively, the conductive leads 150, 160 can be attached to the dielectric frame 130 using a direct bond, a braze, a high temperature reactive solder, or a high temperature adhesive. The direct bond process involves heating the conductive leads and the alumina dielectric frame to a high temperature, for example approximately 1040° C., joining them to each other, and then permitting them to cool down. CuAg eutectic is a conventional braze with a liquidus temperature of about 780° C. which can be used. A high temperature reactive solder, such as AuSi eutectic having a soldering temperature of about 420° C., can be used. Other solders which may be used include AuSn solder and SnAgCu solder. Other high temperature adhesives include a high temperature epoxy or polyimide. For example, MEG-150 epoxy by Materion provides good adhesion to gold-plated copper flanges, and to polyimide frames. MEG-150 can be cured at a temperature of 160-180° C. and pressure of 10 psi (69 kPa). Polyimide adhesives are sold by Polytec PT GmbH of Waldbronn, Germany and Fraivillig Technologies of Boston, Mass.

The air cavity packages of the present disclosure may be particularly suitable for commercial devices (e.g., cellular base station amplifiers). Such devices are not typically subjected to temperature cycling in the field. Therefore, moisture uptake is reduced.

Commercial laterally diffused metal oxide semiconductor (LDMOS) silicon transistors and GaN transistors used in base stations must be in air cavity packages compatible with Moisture Sensitivity Level 3 (MSL 3). Essentially, MSL 3 exposes the lidded assembly to 30° C. and 60% relative humidity for 192 hours, followed by a specific solder reflow thermal profile that peaks at 200° C. The lidded package must then pass gross leak testing in Fluoroinert, and pass other testing requirements. Current manufacturers extensively use epoxy overmolded packages. Such packages are low cost and pass MSL 3. However, epoxy overmolded packages do not have an air cavity. Therefore, the RF performance of the transistor is degraded.

The air cavity packages of the present disclosure may generally be able to withstand the sequential steps of AuSn die attachment (320° C.), lid sealing with epoxy (160° C.), and temperature cycling (e.g., −65° C. to +150° C. for 1000 cycles).

EXAMPLES

Example 1: Ceramic Air Cavity Package

Leads having a thickness of about 0.005 inch (0.13 mm) were gold plated at a thickness of about 0.12 micro-inches or less. The leads were formed from Alloy 42. The leads were bonded to the top surface only of a 96% alumina frame having a thickness of about 0.02 inch (0.5 mm) with a high temperature silicone adhesive. A syringe was used to dispense the adhesive on the surface of the leads. The curing process for the bonding involved using a fixture for placement components. The assembled parts were cured in an air or nitrogen-only oven or furnace at a temperature of about 100° C. to about 300° C. for a period of about 10 minutes to about 60 minutes to fully cure the silicone adhesive. A copper or copper alloy flange having a thickness of about 0.04 inches (1 mm) was plated with a nickel or nickel cobalt alloy having a thickness of about 100 micro-inches or more, followed by gold at a thickness of at least 50 micro-inches. The flange was bonded to the bottom surface only of the alumina frame using a high temperature silicone. A syringe was used to dispense the adhesive on the surface of the frame. The curing process for the bonding involved using a fixture for the placement of components. The assembled parts were cured in an air or nitrogen-only oven at a temperature of about 100° C. to about 300° C. for a period of about 10 minutes to about 60 minutes. The curing of the leads and copper flange to the alumina ceramic frame can be processed as two separate processes or one single process. The assembled header was compatible with a semiconductor chip bonded to the copper flange with AuSn solder. The assembled header passed moisture sensitivity level 3 according to the IPC/JEDEC J-STD-020D.1 standard. The assembled header passed thermal cycling of about −65° C. to about 150° C. in accordance to Mil-Std-883E method 1010, condition C.

Example 2: Polymer Air Cavity Package

Leads having a thickness of about 0.005 inch (0.13 mm) were gold plated at a thickness of about 0.12 micro-inches or less. The leads were formed from Alloy 42. The leads were bonded to the top surface only of a polymer frame having a thickness of about 0.02 inches (0.5 mm) with a high temperature silicone adhesive. The material for the polymer frame was Cirlex®. A syringe was used to dispense the adhesive on the surface of the leads. The curing process for the bonding involved using a fixture for placement of the components. The assembled parts were cured in an air or nitrogen-only oven or furnace at a temperature of about 100° C. to about 300° C. for a period of about 10 minutes to about 60 minutes to fully cure the silicone adhesive. A copper or copper alloy flange having a thickness of about 0.04 inches (1 mm) was plated with a nickel or nickel cobalt alloy having a thickness of at least 100 micro-inches, followed by gold at a thickness of at least 50 micro-inches. The flange was bonded to the bottom surface only of the polymer frame using a high temperature silicone adhesive. A syringe was used to dispense the adhesive on the surface of the frame. The curing process for the bonding involved using a fixture for placement of the components. The assembled parts were cured in an air or nitrogen-only oven or furnace at a temperature of about 100° C. to about 300° C. for a period of about 10 minutes to about 60 minutes. The curing of the leads and copper flange to the polymer frame can be processed as two separate processes or one single process. The assembled header was compatible with a semiconductor chip bonded to the copper flange with AuSn solder. The assembled header passed moisture sensitivity level 3 according to the IPC/JEDEC J-STD-020D.1 standard. The assembled header passed thermal cycling of about −65° C. to about 150° C. in accordance with Mil-Std-883E method 1010, condition C.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

The invention claimed is:

1. An air cavity package adapted to contain a die, comprising:
    a flange having an upper surface; and
    a dielectric frame having an upper surface and a lower surface, the lower surface being attached to the upper surface of the flange;
    wherein the dielectric frame is made of an alumina ceramic, a polyimide, or a semi-crystalline thermoplastic, and the dielectric frame is attached to the upper surface of the flange via a high temperature silicone adhesive capable of withstanding an excursion of 320° C. for 5 minutes.

2. The air cavity package of claim 1, further comprising a first conductive lead and a second conductive lead, attached to opposite sides of the upper surface of the dielectric frame.

3. The air cavity package of claim 2, wherein the first conductive lead and the second conductive lead are attached to the upper surface of the dielectric frame by a high temperature silicone adhesive an excursion of 320° C. for 5 minutes.

4. The air cavity package of claim 3, wherein the high temperature silicone adhesive is a pure silicone or a polydimethylsiloxane filled with about 20 volume percent or less of silica particles.

5. The air cavity package of claim 2, wherein the first conductive lead and the second conductive lead are made of copper, nickel, a copper alloy, a nickel-cobalt ferrous alloy, or an iron-nickel alloy.

6. The air cavity package of claim 2, wherein the first conductive lead and the second conductive lead are attached to the upper surface of the dielectric frame by a direct bond, a braze, a high temperature reactive solder, or a high temperature adhesive.

7. The air cavity package of claim 1, wherein the flange is made of copper, a copper alloy, aluminum, an aluminum alloy, AlSiC, AlSi, Al/diamond, Al/graphite, Cu/diamond, Cu/graphite, Ag/diamond, CuW, CuMo, Cu:Mo:Cu, Cu:Cu-Mo:Cu (CPC), Mo, W, metallized BeO, metallized Si3N4, or metallized AlN.

8. The air cavity package of claim 1, wherein the flange is a substrate plated with one or more metal sublayers.

9. The air cavity package of claim 8, wherein the one or more metal sublayers are made of nickel (Ni), gold (Au), palladium (Pd), chromium (Cr), or silver (Ag).

10. The air cavity package of claim 1, wherein the high temperature silicone adhesive is a polydimethylsiloxane filled with greater than zero to about 20 volume percent of silica particles.

11. The air cavity package of claim 1, wherein the dielectric frame further comprises a filler, wherein the filler is selected from the group consisting of ceramic powder, glass powder, and chopped glass fibers.

12. The air cavity package of claim 1, wherein the dielectric frame has a dielectric constant of about 3.0 to about 10.0.

13. An air cavity package adapted to contain a die, comprising:
    a flange having an upper surface; and
    a dielectric frame having an upper surface and a lower surface,
    wherein the lower surface is attached to the upper surface of the flange via a high temperature silicone adhesive capable of withstanding an excursion of 320° C. for 5 minutes; and
    wherein the high temperature silicone adhesive is a polydimethylsiloxane filled with greater than zero to about 20 volume percent of silica particles.

14. An air cavity package adapted to contain a die, comprising:
    a CuW flange having an upper surface;
    a ceramic dielectric frame having an upper surface and a lower surface, the lower surface being attached to the upper surface of the flange via a high temperature silicone adhesive capable of withstanding an excursion of 320° C. for 5 minutes; and
    a first conductive lead and a second conductive lead, attached to opposite sides of the upper surface of the dielectric frame and each being attached to the upper surface of the dielectric frame by a direct bond.

15. A method for forming an air cavity package, comprising:
    joining a lower surface of a dielectric frame to an upper surface of a flange using a first adhesive composition comprising a high temperature silicone adhesive which can withstand an excursion of 320° C. for 5 minutes;
    joining a first conductive lead and a second lead to an upper surface of the dielectric frame using a second adhesive composition; and
    curing the first adhesive composition and the second adhesive composition, either separately or simultaneously;
    wherein the dielectric frame comprises an alumina ceramic or a polyimide.

16. The method of claim 15, wherein the second adhesive composition is a high temperature silicone adhesive which can withstand an excursion of 320° C. for 5 minutes.

17. The method of claim 16, wherein the high temperature silicone adhesive is a pure silicone or a polydimethylsiloxane filled with about 20 volume percent or less of silica particles.

18. The method of claim 15, wherein the curing is performed at a temperature of about 160° C. to about 220° C. and a pressure of about 10 psi.

19. The method of claim 15, further comprising attaching a die to the upper surface of the flange, wherein the dielectric frame surrounds the die.

\* \* \* \* \*